United States Patent
Van Buskirk et al.

(10) Patent No.: US 7,103,706 B1
(45) Date of Patent: Sep. 5, 2006

(54) SYSTEM AND METHOD FOR MULTI-BIT FLASH READS USING DUAL DYNAMIC REFERENCES

(75) Inventors: Michael A. Van Buskirk, Saratoga, CA (US); Darlene G. Hamilton, San Jose, CA (US); Pua-Ling Chen, Saratoga, CA (US); Kazuhiro Kuribara, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 13 days.

(21) Appl. No.: 10/933,588

(22) Filed: Sep. 3, 2004

Related U.S. Application Data

(63) Continuation of application No. 10/136,173, filed on May 1, 2002, now Pat. No. 6,799,256.
(60) Provisional application No. 60/372,361, filed on Apr. 12, 2002.

(51) Int. Cl.
*G06F 12/00* (2006.01)
*G11C 11/34* (2006.01)

(52) U.S. Cl. .................. 711/103; 711/100; 711/154; 365/185.29; 365/185.33

(58) Field of Classification Search ............... 711/100, 711/102, 103, 154, 156; 365/185.2, 185.21, 365/210, 189.01, 189.09, 230.04, 185.33
See application file for complete search history.

(56) References Cited

U.S. PATENT DOCUMENTS

| | | | | |
|---|---|---|---|---|
| 5,341,489 A | * | 8/1994 | Heiberger et al. | 365/185.11 |
| 5,696,917 A | * | 12/1997 | Mills et al. | 711/1 |
| 5,732,017 A | * | 3/1998 | Schumann et al. | 365/185.11 |
| 5,754,475 A | * | 5/1998 | Bill et al. | 365/185.25 |
| 5,818,759 A | * | 10/1998 | Kobayashi | 365/185.18 |
| 6,026,465 A | * | 2/2000 | Mills et al. | 711/103 |
| 6,260,156 B1 | * | 7/2001 | Garvin et al. | 714/8 |
| 6,477,090 B1 | * | 11/2002 | Yamaki et al. | 365/189.09 |

* cited by examiner

*Primary Examiner*—Tuan V. Thai
(74) *Attorney, Agent, or Firm*—Amin & Turocy, LLP

(57) ABSTRACT

A system and methodology is provided for proper reading of multi-bit memory cells in a memory device. A first reference cell and a second reference cell is employed to determine an average dynamic reference value. The average dynamic reference value is determined by reading a programmed bit of the first reference cell and reading an unprogrammed or erased bit of a second reference cell to determine an average dynamic reference value. The average dynamic reference value can be utilized to determine whether data cells are in a programmed state or in an unprogrammed state.

18 Claims, 9 Drawing Sheets

SYSTEM AND METHOD FOR MULTI-BIT FLASH READS USING DUAL DYNAMIC REFERENCES

CROSS REFERENCE

This application is a continuation application of U.S. patent application Ser. No. 10/136,173, filed May 1, 2002, now U.S. Pat. No. 6,799,256 entitled METHODS FOR MULTI-BIT FLASH READS USING DUAL DYNAMIC REFERENCES; which claims benifit to U.S. Provisional Patent Application Ser. No. 60/372,361, filed Apr. 12, 2002, entitled METHODS FOR MULTI-BIT FLASH READS USING DUAL DYNAMIC REFERENCES, the entireties of which are hereby incorporated by reference.

FIELD OF INVENTION

The present invention relates generally to memory systems and in particular to systems and methods for accurately reading multi-bit flash memory devices.

BACKGROUND OF THE INVENTION

Flash memory is a type of electronic memory media that can be rewritten and that can retain content without consumption of power. Flash memory devices generally have life spans from 100K to 300K write cycles. Unlike dynamic random access memory (DRAM) devices and static random memory (SRAM) devices in which a single byte can be erased, flash memory devices are typically erased and written in fixed multi-bit blocks or sectors. Flash memory technology evolved from electrically erasable read only memory (EEPROM) chip technology, which can be erased in situ. Flash memory devices are less expensive and more dense as compared to many other memory devices, meaning that flash memory devices can store more data per unit area. This new category of EEPROMs has emerged as an important non-volatile memory that combines advantages of erasable programmable read only memory (EPROM) density with EEPROM electrical erasability.

Conventional flash memory devices are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as having a stacked gate structure overlying a channel. The stacked gate may further include a thin gate dielectric layer (sometimes referred to as a layer of tunnel oxide) formed on the surface of a substrate or P-well. The stacked gate also includes a polysilicon floating gate overlying the tunnel oxide and an interpoly dielectric layer overlying the floating gate. The interpoly dielectric is often a multilayer insulator such as an oxide-nitride-oxide (ONO) layer having two oxide layers sandwiching a nitride layer. Lastly, a polysilicon control gate overlies the interpoly dielectric layer.

The control gate is connected to a wordline associated with a row of such cells to form sectors of such cell in a typical NOR configuration. In addition, the drain regions of the cells are connected together by a conductive bitline. The channel of the cell formed between the source and drain regions conducts current between the source and drain in accordance with an electric field formed in the channel by a voltage applied to the stacked gate structure by a wordline attached to the stacked gate structure. In the NOR configuration, each drain terminal of the transistors within a column is connected to the same bitline. In addition, the stacked gate structure of each flash cell in a row is connected to the same wordline. Typically, the source terminal of each cell is connected to a common source terminal. In operation, individual flash cells are addressed via the respective bitline and wordline employing peripheral decoder and control circuitry for programming (writing), reading and erasing the cell.

The single bit stacked gate flash memory cell is programmed by applying a programming voltage to the control gate, connecting the source to ground and connecting the drain to a programming voltage. The resulting high electric field across the tunnel oxide results in a phenomenon deemed "Fowler-Nordheim" tunneling. During Fowler-Nordheim tunneling, electrons in the channel region tunnel through the gate oxide into the floating gate and become trapped in the floating gate. As a result of the trapped electrons, the threshold voltage of the cell increases. This change in the threshold voltage VT (and thereby the channel conductance) of the cell created by the trapped electrons causes the cell to be programmed.

In order to erase a typical single bit stacked gate flash memory cell, a voltage is applied to the source, the control gate is held at a negative potential, and the drain is allowed to float. Under these conditions, an electric field is developed across the tunnel oxide between the floating gate and the source. The electrons that are trapped in the floating gate flow toward and cluster at a portion of the floating gate overlying the source region. The electrons are then extracted from the floating gate and into the source region by way of Fowler-Nordheim tunneling through the tunnel oxide. The cell is erased as the electrons are removed from the floating gate.

In conventional single bit flash memory devices, erase verification is performed to determine whether each cell in a block or set of cells has been properly erased. Current single bit erase verification methodologies provide for verification of bit or cell erasure, and application of supplemental erase pulses to individual cells that fail the initial verification. Thereafter, the erased status of the cell is again verified and the process continues until the cell or bit is successfully erased or the cell is marked as unusable.

Recently, multi-bit flash memory cells have been introduced that allow the storage of multiple bits of information in a single memory cell. Techniques that have been developed with conventional single bit flash memory devices do not work well for the new multiple bit flash memory cells. For example, a dual bit flash memory structure has been introduced that does not utilize a floating gate, such as an ONO flash memory device that employs a polysilicon layer over the ONO layer for providing wordline connections. In a dual bit memory device, one side of a dual bit memory cell is called a complimentary bit (CB) and the other side of the dual bit memory cell is called a normal bit (NB). The dual bit memory cell uses a layer of nitride in an ONO (oxide-nitride-oxide) stack to store charge; and since nitride is not a conductor, the charge added or removed during the program and erase operations should not redistribute to other regions of the layer of nitride. However, the buildup of charge and leakage in one bit does effect the other bit changing the reading, programming and erase characteristics of the cell in subsequent cycles. Eventually, the buildup of residual or leakage charge changes the effective VT of the CB and the NB.

One significant problem with dual bit operation is a result of a shift in a blank read current of the complimentary bit when the normal bit is programmed and a shift in the blank read current in the normal bit when the complimentary bit is programmed. This shift in VT with the other side programmed is called "CBD" or complimentary bit disturb. The CB and NB regions are near the drain/source junctions of the cell and are modified during programming and erase operations. Another problem is caused by charge loss after cycling of the cell. Therefore, a major challenge for dual bit operation manifests from the combination of the charge loss and complimentary bit disturb under the two conditions: (1) CBD at BOL (beginning of life) and (2) charge loss post cycling at EOL (end of life or post bake). Test data indicates that the CBD is higher near the BOL and the VT distributions overlay the program VT after cycling and bake (EOL). The overlap of the two distributions prevents normal read sensing schemes from working correctly for dual bit operations. In other words, it cannot be determined whether the data in a CB or NB is a one or a zero because as the VT distributions approach each other.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

A system and methodology is provided for proper reading of multi-bit memory cells in a memory device (e.g., flash memory) over the life of the device (e.g., 100K–300K program and erase cycles). The present invention utilizes a first reference cell and a second reference cell to determine an average dynamic reference value. The average dynamic reference value is determined by reading a programmed bit of the first reference cell and reading an unprogrammed or erased bit of a second reference cell to determine an average dynamic reference value. The average dynamic reference value can be utilized to determine whether data cells are in a programmed state (e.g., logic 1) or in an unprogrammed state (e.g., logic 0). The read currents from the first reference cell and the second reference cell are averaged to determine an average dynamic reference value. The average dynamic reference value can be converted to a voltage threshold (VT) that can be compared with a VT of a data bit to differentiate a programmed bit from an unprogrammed bit.

Program and erase cycles are performed on the reference cells along with data cells of the memory device and are left blank until the "page" or "word" is programmed. This means that the references are the same "age" because they have endured a same number of cycles as the data cells to which they are being compared. Therefore, the reference cells will provide dynamic reference values that track charge loss and CBD of the associated data dells. The dynamic reference value tracks change in voltage threshold and the effects that complimentary bit disturb have on one or more data cells that occur during normal cycling of the memory device.

In one particular aspect of the invention, one bit of a first reference cell and one bit of a second reference cell is programmed prior to normal operation. A programmed bit of the first reference cell is read to track charge loss of the data cells and an unprogrammed bit is read from the second reference cell to track CBD caused by the programmed bit of the second reference cell.

In accordance with an aspect of the invention, a first reference cell and a second reference cell are associated with a word in a memory array. The first reference cell and second reference cell can be employed to determine if bits in a word are programmed (e.g., logic 1) or unprogrammed or erased (e.g., logic 0). Alternatively, a first reference cell and a second reference cell can be associated with bits in a wordline—a wordline can include a plurality of words. Additionally, a first reference cell and a second reference cell can be associated with a sector or an entire memory device.

In accordance with another aspect of the invention, multi-bit flash memory cells and associated reference arrays are cycled (e.g., program and erase cycles) with multi-bit flash memory cells in the sector so that all the cells in the sectors and associated reference arrays are the same "age." The associated reference arrays include a first dynamic array and a second dynamic array. A comparison circuit compares the data read from a cell to an average value derived from the first dynamic array and the second dynamic array to verify bits in the sector. The multi-bit flash memory array that allows multi-bit operation of the flash memory device by allowing the use of dual dynamic references that are cycled with the multi-bit memory cells in the flash memory.

The following description and the annexed drawings set forth certain illustrative aspects of the invention. These aspects are indicative, however, of but a few of the various ways in which the principles of the invention may be employed. Other advantages and novel features of the invention will become apparent from the following detailed description of the invention when considered in conjunction with the drawings.

DETAILED DESCRIPTION OF THE INVENTION

The present invention relates to proper reading of multi-bit memory cells over the life of a memory device. The present invention utilizes a first reference cell to track charge loss associated with data bits in a multi-bit memory device and a second reference cell to determine CBD effects on data bits in the multi-bit memory device. Program and erase cycles are performed on the reference cells along with the memory cells, so that the data cells and reference cells are the same "age." An average dynamic reference value is determined and utilized to determine if data bits are programmed or unprogrammed. Although the invention is hereinafter illustrated and described in association with an ONO dual bit memory cell architecture wherein both bits of each cell are used for data storage, it will be appreciated that the invention is applicable to other type architectures and other multi-bit architecture usage schemes.

Figure 1:
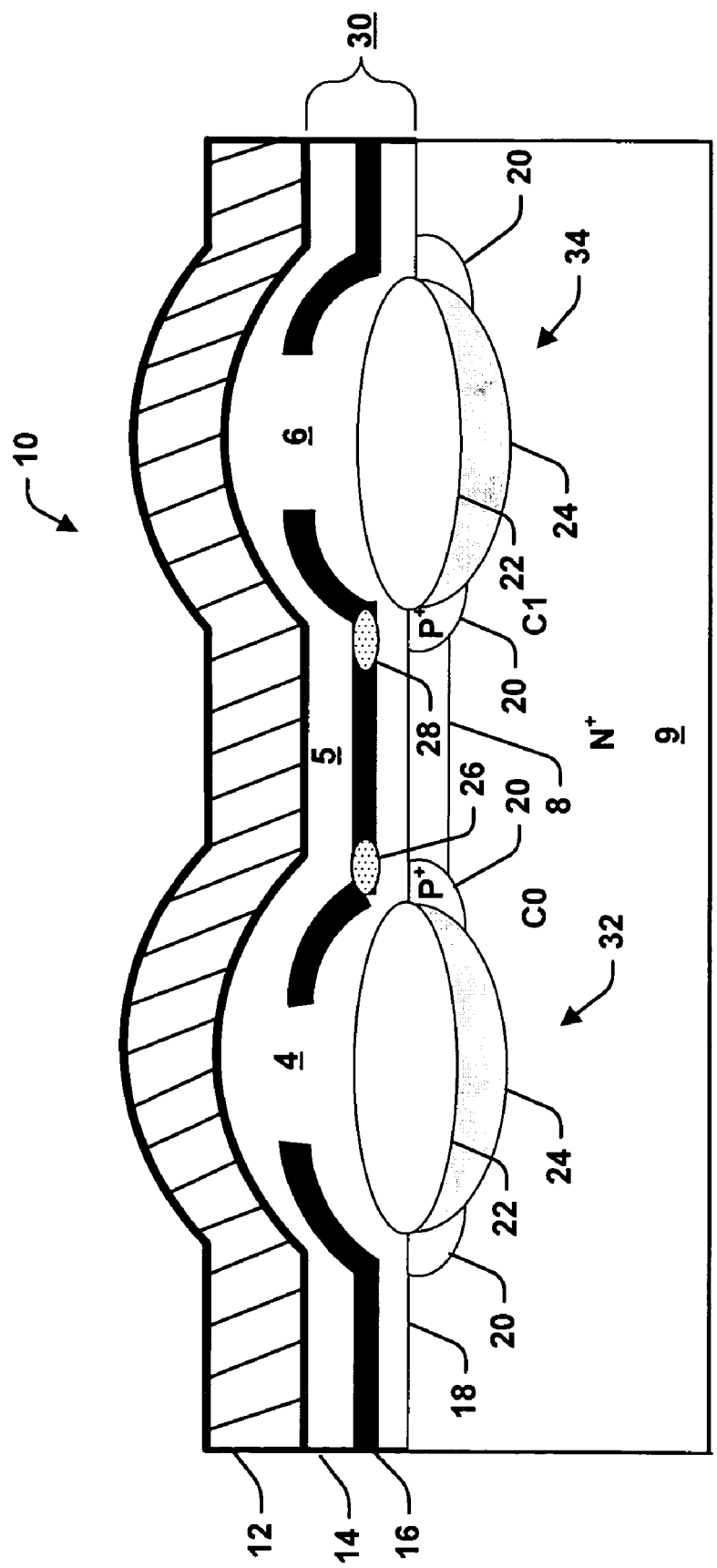
FIG. 1 illustrates a side cross-sectional view of an exemplary dual bit memory cell in which various aspects of the present invention may be implemented.

FIG. 1 illustrates an exemplary dual bit memory cell 10 in which one or more of the various aspects of the invention may be carried out. The memory cell 10 comprises a silicon nitride layer 16 sandwiched between a top silicon dioxide layer 14 and a bottom silicon dioxide layer 18 forming an ONO layer 30. A polysilicon layer 12 resides over the ONO layer 30 and provides a wordline connection to the memory cell 10. A first bitline 32 runs underneath the ONO layer 30 under a first region 4 and a second bitline 34 runs underneath the ONO layer 30 under a second region 6. The bitlines 32 and 34 are formed of a conductive portion 24 and an optional oxide portion 22. Boron core implants 20 are provided on both ends of each bitline 32 and 34 where the bitines meet the bottom silicon dioxide layer 18 or along the entire transistor. The boron core implants are more heavily doped than the P-type substrate and assist in control of the VT of the memory cell 10. The cell 10 resides on a P-type substrate 9 with the conductive portion 24 of the bitlines 32 and 34 being formed from an N+ arsenic implant, such that a channel 8 is formed between the bitlines 32 and 34 and across the P-type substrate. The memory cell 10 is comprised of a single transistor having interchangeable source and drain components formed from the N+ arsenic implant portions 24 residing on the P-type substrate region 9 with a gate formed as part of a polysilicon wordline 12.

Although the first and second bitlines 32 and 34 are illustrated with respect to a conductive portion 24 and an optional oxide portion 22, it is appreciated that the bitlines can be formed from a conductive portion only. Furthermore, although the drawing of FIG. 1 illustrates gaps in the silicon nitride layer 16, it is to be appreciated that the silicon nitride layer 16 may be fabricated with out gaps as a single strip or layer.

The silicon nitride layer 16 forms a charge trapping layer. Programming of the cell is accomplished by applying voltages to the drain and the gate and grounding the source. The voltages generate electrical fields along the channel causing electrons to accelerate and jump from the substrate layer 9 into the nitride which is known as hot electron injection. Since the electrons gain the most energy at the drain, these electrons become trapped and remain stored in the nitride layer near the drain. The cell 10 is generally uniform and the drain and source are interchangeable. Since the silicon nitride is non-conducting, a first charge 26 can be injected into the nitride 16 near a first end of the central region 5 and a second charge 28 can be injected into the nitride 16 near a second end of the central region 5. Therefore, if the charge does not move then there can be two bits per cell instead of one bit.

As previously noted, the first charge 26 can be stored in the nitride layer 16 at the first end of the central region 5 and the second charge 28 can be stored at the second end of the central region 5 such that two bits can reside per memory cell 10. The dual bit memory cell 10 is generally symmetrical, thus the drain and the source can be interchangeable. Thus, the first bitline 32 can serve as the drain terminal and the second bitline 34 as the source terminal when programming the left bit C0. Likewise, the second bitline 34 can serve as the drain terminal and the first bitline 32 as the source terminal for programming the right bit C1. Table 1 illustrates one particular set of voltage parameters for performing reading, programming and single sided erases of the dual bit memory cell 10 having the first bit C0 and the second bit C1.

TABLE I

| Operation | Cell | Gate | Bitline 0 | Bitline 1 | Comment |
|---|---|---|---|---|---|
| read | C0 | Vcc | 0 v | 1.2 v | complimentary column |
| read | C1 | Vcc | 1.2 v | 0 v | normal column |
| program | C0 | Vpp | 5–6 v | 0 v | hot electron |
| program | C1 | Vpp | 0 v | 5–6 v | hot electron |
| One side - erase | C0 | −3 to −6 v | 5–6 v | Float | hot hole injection |
| One side - erase | C1 | −3 to −6 v | Float | 5–6 v | hot hole injection |

Various implementations of dual bit memory cell architecture may be achieved according to one or more aspects of the present invention. In particular, the invention is applicable to memory devices wherein both bits in a dual bit cell are employed for data or information storage. The inventors of the present invention have found that program and erasure of one bit (e.g., bit C0) in such a cell effects programming, reading and/or erasure of its associated bit (e.g., bit C1). For example, repeated programming of bit C1 of cell 10 can cause charge accumulation in bit C0 and vice versa. Also, repeated application of erase voltage pulses to bit C1 can cause over erasure of bit C0. These phenomena in the associated bit C0 can in turn result in degradation with respect to operation of the bits during normal operation (e.g., the ability to effectively read, write/program, and/or erase one or both bits).

The inventors have determined that a major challenge for dual bit operation comes from the combination of the charge loss and complimentary bit disturb under the two conditions: (1) CBD at BOL (beginning of life) and (2) charge loss post cycling at EOL (end of life or post bake). Test data indicates that the CBD is higher near the BOL and the VT distributions overlay the program VT after cycling and bake (EOL). The overlap of the two distributions prevents normal read sensing schemes from working correctly for dual bit operations. In other words, it cannot be determined whether the data in a CB or NB is a one or a zero.

Many flash memories are provided with command logic and embedded state machines which perform complex programming and erasing operations automatically. A static random access memory (SRAM) module component can include the programs implemented by a micro-controller for use in controlling operations of command logic and a memory system. These programs are typically loaded into an SRAM when a system is powered up. A bus can be used to send control commands from a processor to the command logic device and to exchange the data read from or written to the flash memory device with the command logic and a host processor. The embedded state machines of the flash device generate the command logic controls for detailed operations such as the various individual steps necessary for carrying out programming, reading and erasing operations. The state machine thus functions to reduce overhead required of a processor (not depicted) typically used in association with a microchip containing the flash memory.

Figure 2:
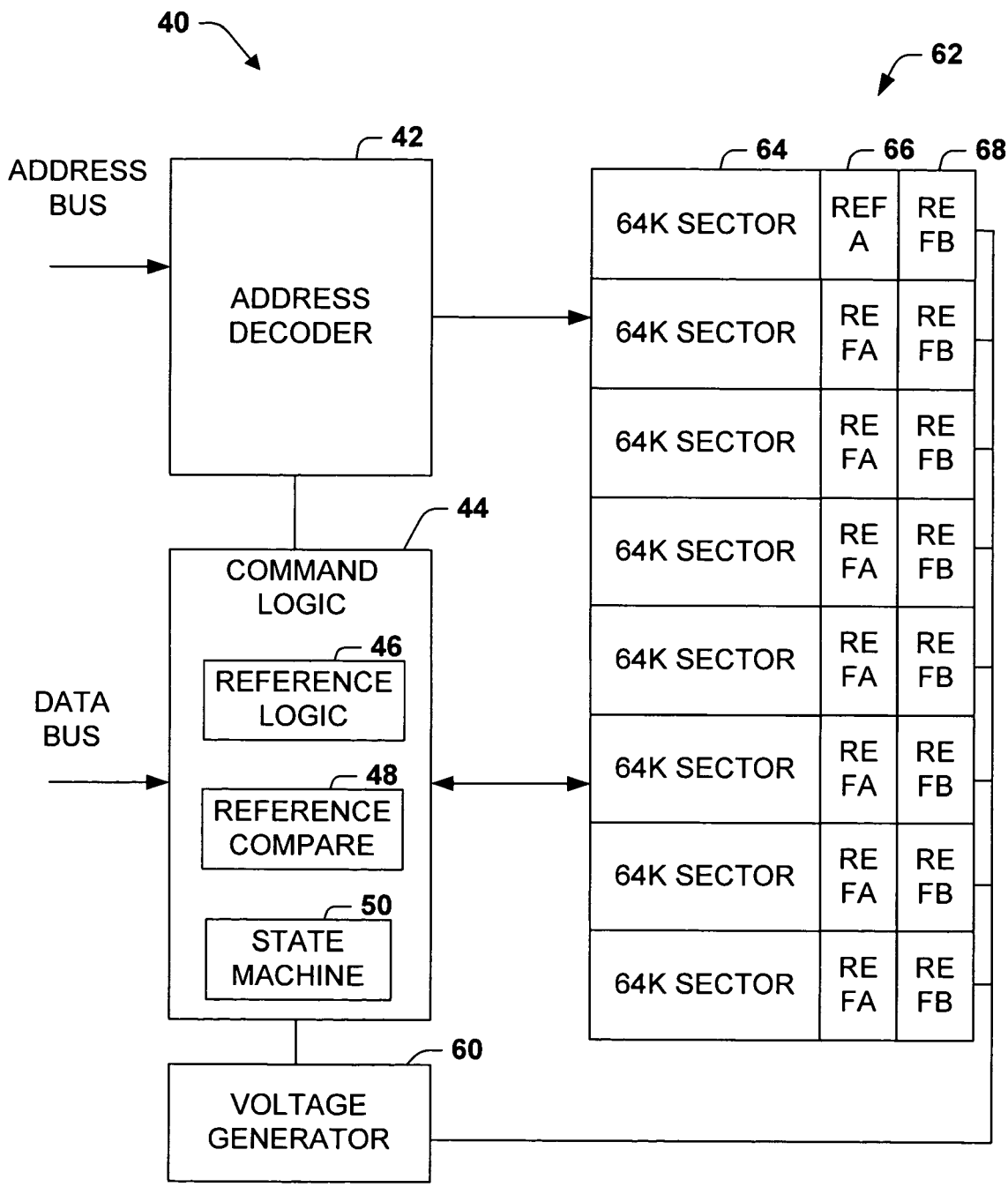
FIG. 2 illustrates a block diagram of a system adapted to carry out various aspects of the invention.

FIG. 2 illustrates a system 40 for performing proper programming, erasing and reading of a memory array 62 employing the dual bit memory cells of the present invention. In the present example, the memory array 62 is comprised of a plurality of 64K sectors 64. A sector of the flash memory array 64 includes a portion of the memory array 62 consisting of all the memory cells grouped together via the wordlines that share the same sector address. The sector address is typically the n (e.g., six) most significant address bits of the address bit signals used to address one or more cells in the memory device where n is an integer. For example, a 64K sector 64 can be comprised of 8 IOs where an IO is a row of 4 cells or 4 dual bit memory cells having 4 normal bits and 4 complimentary bits. It is to be appreciated that the memory array 62 can be any number of different configurations, for example, 128K sectors comprised of 8 normal bits and 8 complimentary bits on 8 cells. In addition any number of sectors may be employed only limited by the size of the application and the size of the device employing the flash memory array 62.

Associated with each 64K sector 64 is a first dynamic reference array 66 and a second dynamic reference array 68. The first dynamic reference array 66 tracks charge loss of data bits associated with the cycling the sector 64 and the second dynamic reference array tracks the effects of CBD on the data bits associated with cycling of the sector 64. The first dynamic reference array 66 and the second dynamic reference array 68 are cycled with the data bits of a corresponding sector 64 so that the reference arrays age with the corresponding sector 64. The reference array 66 and 68 can include reference cells associated with words, wordlines or sectors.

The system 40 includes an address decoder 42 connected to the flash memory array 62 for decoding IOs during various operations that are performed on the array 62 (e.g., programming, reading, verifying, erasing). The address decoder 42 receives address bus information from a system controller (not shown) or the like.

A command logic component 44 includes, a reference logic component 46, a reference comparator component 48 and an internal state machine 50. The command logic component 44 is connected to the address memory array 62. The command logic and state machine 50 receives commands or instructions from a databus connected to a system controller or the like. The commands or instructions invoke algorithms embedded in the command logic 44 and state machine 50. The algorithms perform various methodologies of programming, reading, erasing, soft programming and verifying to be described herein. A voltage generator component 60 is also connected to the memory array 62 and the command logic 44 and state machine 50. The voltage generator component 60 is controlled by the command logic 44 and state machine 50. The voltage generator component 60 is operable to generate necessary voltages for programming, reading, erasing, soft programming and verifying of the memory cells of the memory array 62.

During a program and erase cycle of a sector, the command logic 44 and state machine 50 program the data bits in the sector and the reference bits in the first reference array 66 and the second reference array 68. The command logic 44 and state machine 50 then erase the data bits in the sector and the reference bits in the first reference array 66 and the second reference array 68. The command logic 44 and state machine 50 then program one bit of the reference cells in the first reference array 66 and program one bit of the reference cells in the second reference array 68. During a read operation, a data bit is read, for example, by reading one or more words in a sector. The command logic 44 and state machine 50 reads a programmed bit from a cell in the first reference array 66 and reads an erased bit from a cell in the second reference array 68. The read values are provided to the reference logic component 46 which determines an average reference value (e.g., $VT_{AVG}$). The average reference value is provided to a reference compare component 48. The reference compare component 48 compares the reference value with the read data bits to determine if the bits are in a programmed state or an unprogrammed state.

Figure 3:
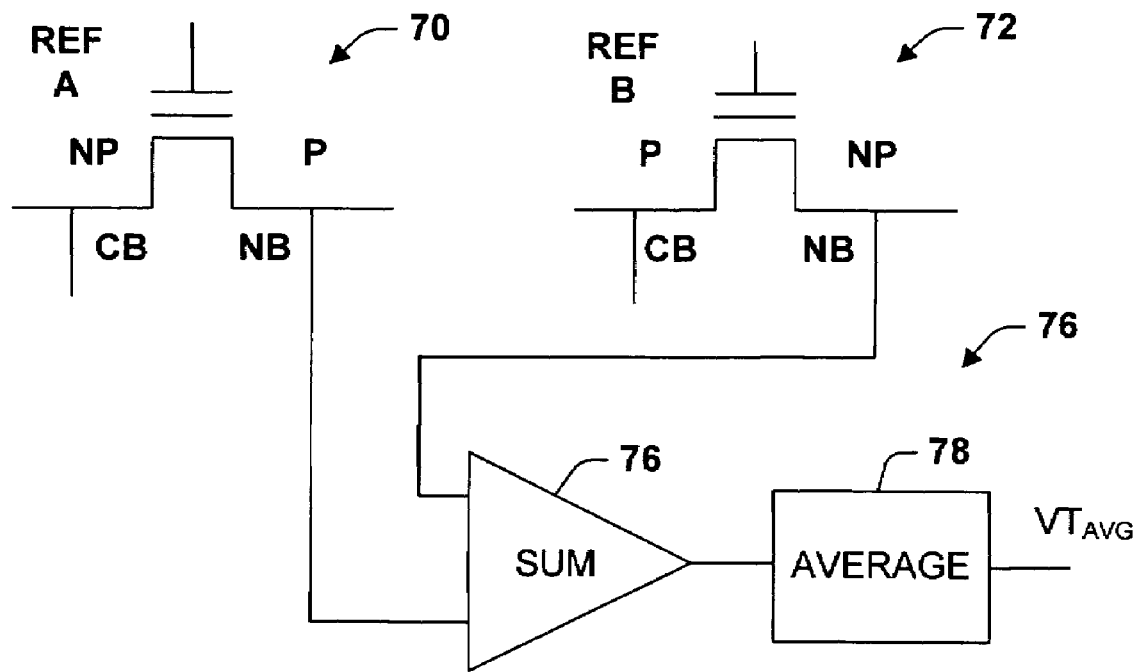
FIG. 3 illustrates a schematic block diagram of a circuit for determining an average threshold value using normal bits of two reference cells in accordance with an aspect of the present invention.

FIG. 3 illustrates a circuit 76 for determining a voltage threshold average ($VT_{AVG}$) from two dual bit reference cells in accordance with an aspect of the present invention. A first reference cell 70 (REF A) includes a complimentary bit (CB) and a normal bit (NB). The NB is programmed (P) and the CB is unprogrammed (NP). A second reference cell 72 (REF B) includes a CB and an NB. The CB is programmed (P) and the NB is unprogrammed (NP). During a read operation, a summer 76 sums the read currents of the programmed NB of the first reference cell 70 and the unprogrammed NB of the second reference cell 72. The summer 76 converts the currents to a voltage and provides the voltage to an average component 78. The average component 78 can be, for example, a simple voltage divider. The average component 78 then provides the average reference threshold voltage $VT_{AVG}$. $VT_{AVG}$ can be used to determine whether a data bit is a programmed bit or an unprogrammed bit. It is to be appreciated that $VT_{AVG}$ can be determined from summing the unprogrammed CB of the first reference cell 70 with the programmed CB of the second reference cell 72.

Figure 4:
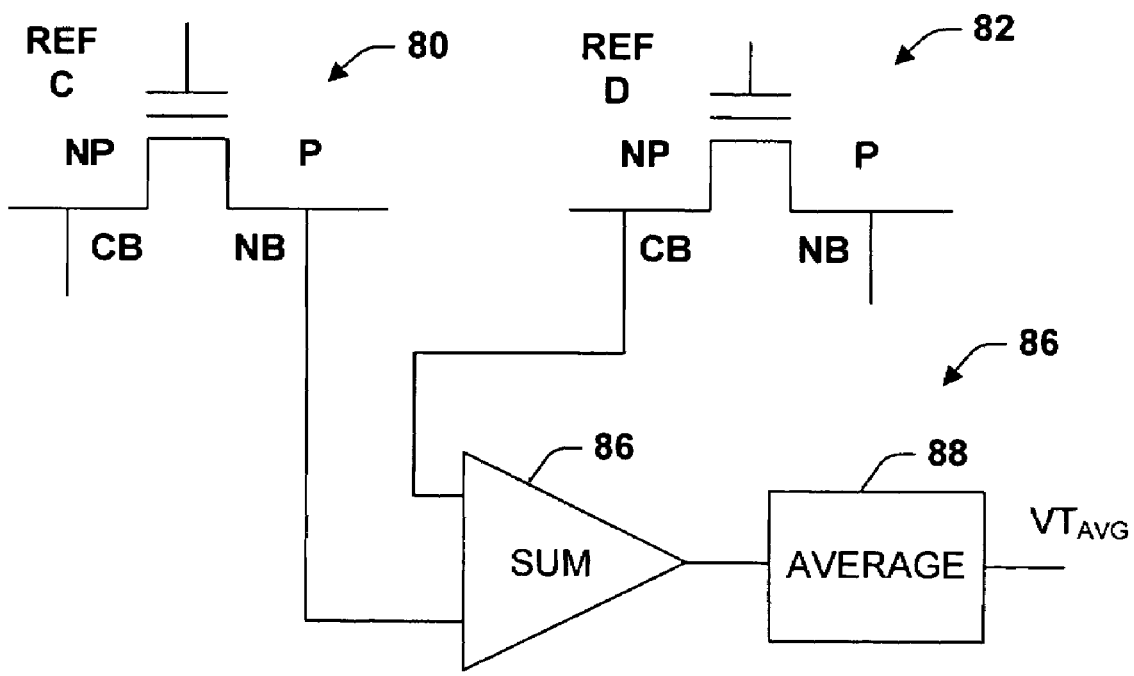
FIG. 4 illustrates a schematic block diagram of a circuit for determining an average threshold value using a normal bit of a first reference cell and a complimentary bit of a second reference cell in accordance with an aspect of the present invention.

FIG. 4 illustrates a circuit 86 for determining a voltage threshold average ($VT_{AVG}$) from two dual bit reference cells in accordance with another aspect of the present invention. A first reference cell 80 (REF C) includes a CB and an NB. The NB is programmed (P) and the CB is unprogrammed (NP). A second reference cell 82 (REF D) includes a CB and an NB. The CB is unprogrammed (P) and the NB is programmed (NP). During a read operation, a summer 86 sums the read currents of the programmed NB of the first reference cell 80 and the unprogrammed CB of the second reference cell 82. The summer 86 converts the currents to a voltage and provides the voltage to an average component 88. The average component 88 then provides the average reference threshold voltage $VT_{AVG}$. $VT_{AVG}$ can be employed to determine whether a data bit is a programmed bit or an unprogrammed bit. It is to be appreciated that $VT_{AVG}$ can be determined from summing the unprogrammed CB of the first reference cell 80 with the programmed NB of the second reference cell 82. FIGS. 3–4 illustrate that any suitable combination of programmed bit of one reference combined with an unprogrammed bit of another reference can be employed to determine $VT_{AVG}$.

Figure 5:
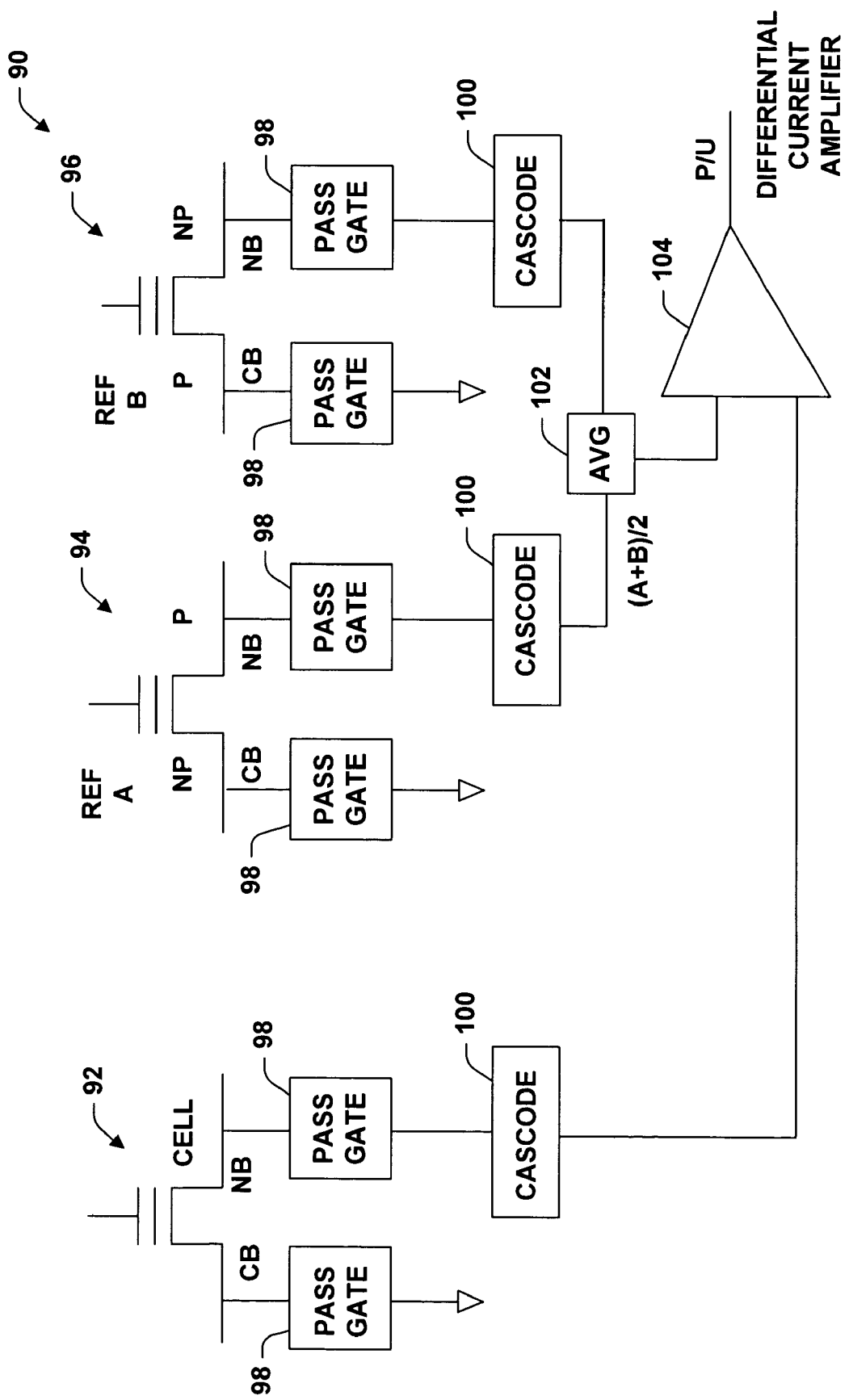
FIG. 5 illustrates a schematic block diagram of a comparison circuit in accordance with an aspect of the present invention.

FIG. 5 is a schematic illustrating a comparison circuit 90 having a data cell 92, a first reference cell 94 from dynamic reference A, and a second reference cell 96 from dynamic reference B. The data cell 92 has a CB and an NB. The reference cells 94 and 96 also have a CB and an NB. Associated pass gates 98 are connected to the CB and NB sides of the cells 92, 94 and 96. In the example illustarted in FIG. 5, the data from the NB side of cell 92 is being compared to averaged data from the NB sides of dynamic reference cells 94 and 96. In this example, the NB of one reference cell would be programmed and the NB of the other cell would be unprogrammed.

As should be appreciated, if the data from the CB side of cell 92 is to be compared, the CB side of cells 94 and 96 can be averaged. Reading operations are simpler if the CBs of the reference cells are utilized to read CBs of data cells and the NBs of the reference cells are utilized to read NBs of data cells. The outputs of pass gates 98 are input into respective cascode amplifiers 100. The output of cascode amplifier 100 corresponding to the NB of the first reference cell 94 and the NB of the second reference cell is provided to an averager 102. The averager 102 provides an average value that corresponds to an average of a programmed bit and an unprogrammed bit. The output of the averager 102 is provided into a differential sense amplifier 104, which is compared with the output of the cascode corresponding to the NB of the data cell 92. The differential sense amplifier 104 provides an output corresponding to whether the NB of the data cell 92 is in a programmed state or an unprogrammed state.

Figure 6:
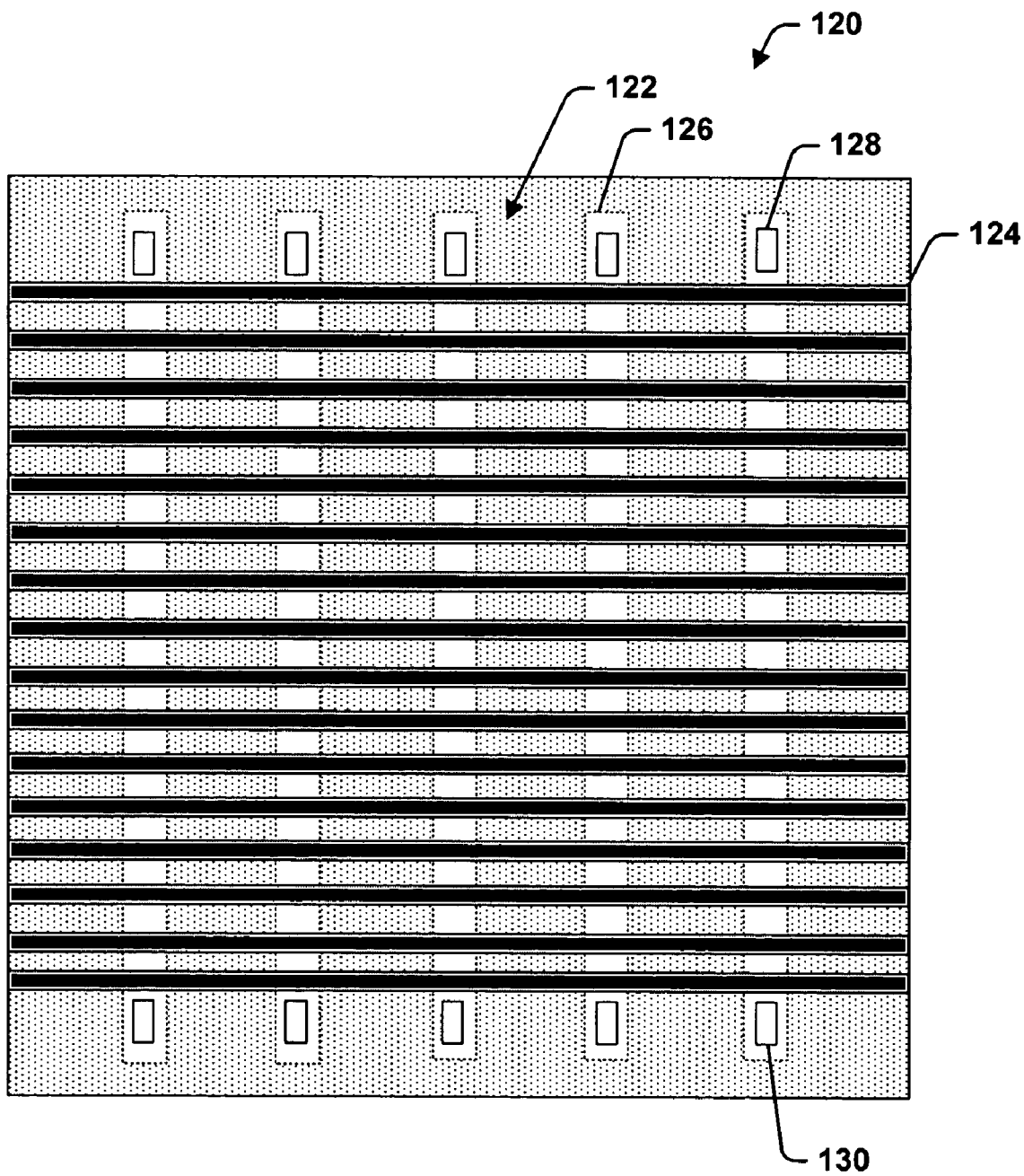
FIG. 6 illustrates a partial top view of a 64K sector of an array of dual bit flash memory in accordance with an aspect of the present invention.

FIG. 6 illustrates a partial memory cell layout from a top or plan view of an example of a 64K block 120. The present example is illustrated with respect to a 64K block of 16 bit I/Os. It is to be appreciated that blocks may be 8 bit, 32 bit, 64 bit or more I/Os and are not limited to 64K (e.g., 128K, 256K). The 64K block 120 can be a sector or a portion of a sector. For example, one or more blocks with the contacts connecting common metal bitlines can form a sector. An ONO stack strip or layer 122 extends a length of the memory array and includes the block 120. The block 120 includes 16 I/Os or groups of columns 126. Each "word" or group of IO's is comprised of eight transistors or eight normal bits and eight complimentary bits. Each I/O includes a polysilicon wordline 124 for addressing the rows of cells. A plurality of bit lines extend underneath the ONO stack strip layer 122 for enabling reading, writing and erasing of individual bits of the memory cells. Each bitline is connected to a first contact 128 and metal bitlines (not shown) at one end of a group of sixteen rows and a second contact 130 at the other end of the group. In the example of FIG. 6, five bit lines are illustrated such that a bitline is coupled to an end of every other transistor in a column and two select transistors are employed to select between four bits of two transistors for reading, writing and erasing.

Figure 7:
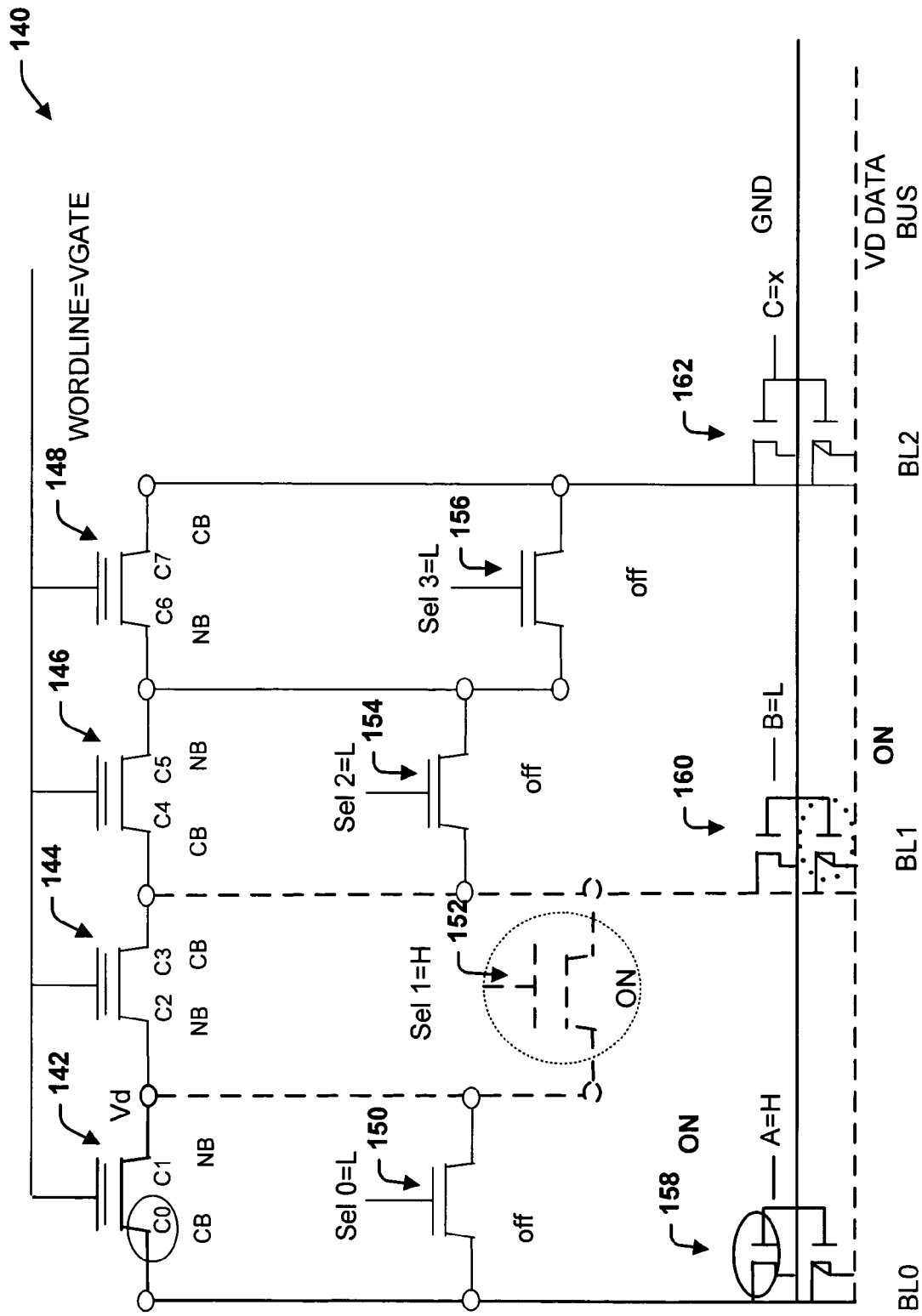
FIG. 7 illustrates a schematic view of a portion of a row of dual bit memory cells in accordance with an aspect of the present invention.

FIG. 7 illustrates a schematic diagram of addressing of the first four dual bit memory cells in a row utilizing selection transistors and three bitlines for reading, writing and erasing bits. A first dual bit memory cell 142 includes a first bit C0 and a second bit C1, a second dual bit memory cell 144 includes a first bit C2 and a second bit C3, a third dual bit memory cell 146 includes a first bit C4 and a second bit C5 and a fourth dual bit memory cell 148 includes a first bit C6 and a second bit C7. The four dual bit memory cells could form a 8-bit word. A select gate 150 (Sel0) and a select gate 152 (Sel1) are provided to enable reading, writing and erasing of the bits C0, C1 of dual bit memory 142 and bits C2 and C3 of dual bit memory 144. A select gate 154 (Sel2) and a select gate 156 (Sel3) are provided to enable reading, writing and erasing of the bits C4, C5 of dual bit memory 146 and bits C6 and C7 of dual bit memory 148. A first switch 158 is connected to a first bitline BL0, a second switch 160 is connected to a second bitline BL1 and a third switch 162 is connected to a third bitline BL2. The first, second and third switches couple the corresponding bitline between power (VDD) and ground (GND). Any bit of the dual bit memory cells can be read by providing different voltage configurations as illustrated in Table 2 below. In the example depicted in FIG. 7, cell C0 of dual bit memory cell 142 is being read.

TABLE 2

| cell | WL | A | B | C | sel 0 | sel 1 | sel 2 | sel 3 | BL 0 | BL 1 | BL 2 |
|---|---|---|---|---|---|---|---|---|---|---|---|
| C0 | Vgate | H | L | x | L | H | L | L | GND | VD | X |
| C1 | Vgate | L | H | x | L | H | L | L | VD | GND | X |
| C2 | Vgate | H | L | x | H | L | L | L | GND | VD | X |
| C3 | Vgate | L | H | x | H | L | L | L | VD | GND | X |
| C4 | Vgate | x | H | L | L | L | L | H | X | GND | VD |
| C5 | Vgate | x | L | H | L | L | L | H | X | VD | GND |
| C6 | Vgate | x | H | L | L | L | H | L | X | GND | VD |
| C7 | Vgate | x | L | H | L | L | H | L | X | VD | GND |

Figure 8:
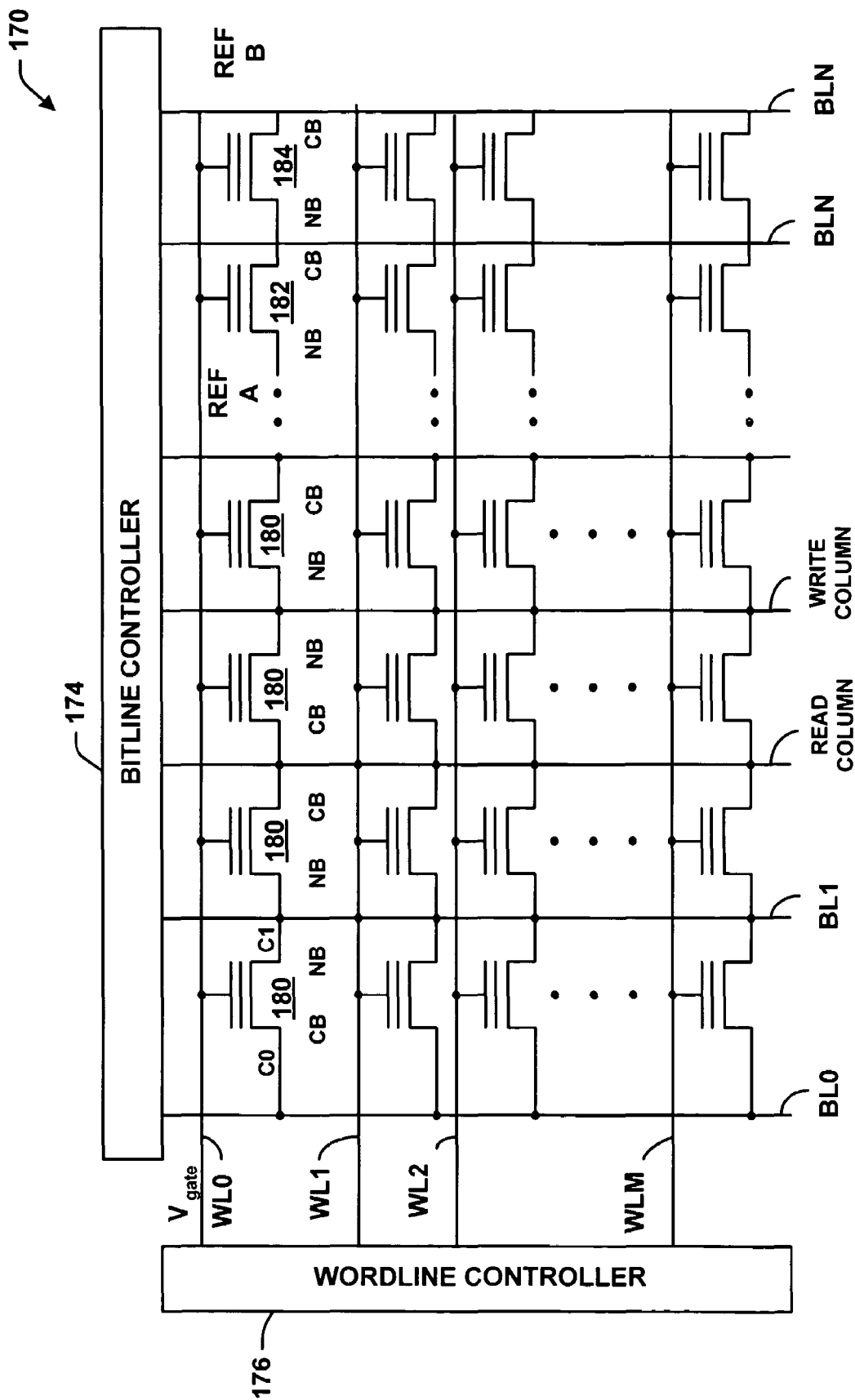
FIG. 8 illustrates a schematic block diagram of a system for reading a portion of a sector with a reference cell pair being associated with wordlines in accordance with an aspect of the present invention.

FIG. 8 illustrates a system 170 for reading a portion of a sector of cells 172 in accordance with an aspect of the present invention. The sector 172 is an array of double bit cells, such as cells 180. The system 170 includes a bitline controller 174 and a wordline controller 176 that decode I/Os during various operations that are performed on the sector 172 (e.g., programming, reading, verifying, erasing). The bitline controller 174 and wordline controller 176 receive address bus information from a system controller (not shown) or the like. Dual bit memory cells such as cells 180 are formed in M rows and N columns. A common wordline is attached to the gate of each cell in a row, such as wordlines WL0, WL1, WL2, through WLM. A common bitline is attached to each cell in a column, such as bitlines, BL0, BL1, through BLN. Associated with each wordline is a first dynamic reference memory cell 182 (REF A) and a second dynamic reference memory cell 184 (REF B). A wordline can contain, for example, 1000 bits forming multiple words and a sector can include, for example, 512 wordlines to provide 512K bits of memory. The first dynamic reference memory cell 182 and the second dynamic reference memory cell 184 associated with a wordline are used during reading of bits contained in words or multiple words for a corresponding wordline. This allows for process variations associated with data cells in a wordline to be reflected in the corresponding reference cells.

Figure 9:
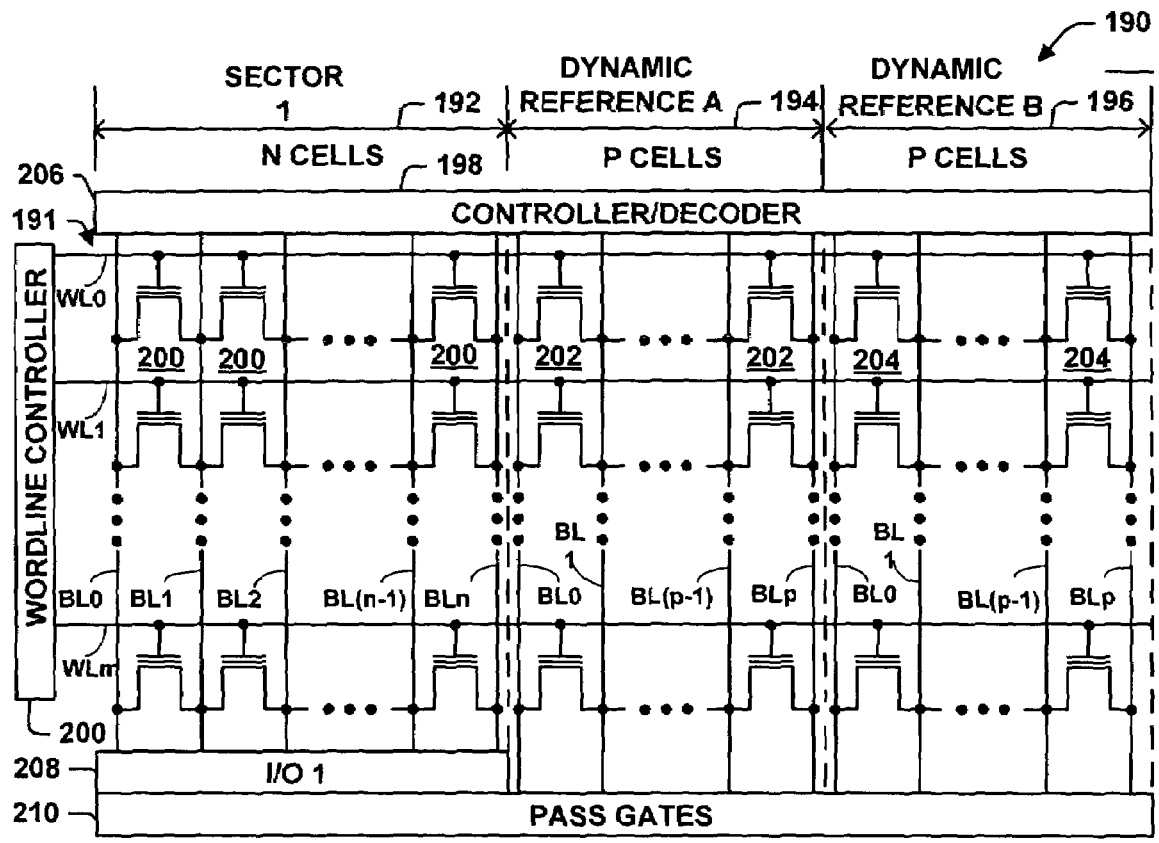
FIG. 9 illustrates a schematic block diagram of a system for reading a portion of a sector with a reference cell pair being associated with words in accordance with an aspect of the present invention.

FIG. 9 illustrates a system 190 for reading a sector of cells 191 in accordance with an aspect of the present invention. The sector of cells 191 include a data sector portion 192, a dynamic reference A portion 194, and a dynamic reference B portion 196 wherein dynamic reference A 194 and dynamic reference B 196 make up a reference array. The dynamic reference A 194 and dynamic reference B 196 provide individual references associated with words in a wordline, such that each word is provided with associated references. Although the reference arrays are illustrated as separate structures, the reference cells can be interweaved within the data sector portion 192.

The sector 192 is illustrated as having N cells. It should be appreciated that the sectors in a memory array can have a variety of differing numbers of cells. Dynamic reference A 194 and dynamic reference B 196 are illustrated as having P cells each. The sector 192 includes a plurality of dual bit data cells 200, dynamic reference A 194 includes a plurality of dual bit reference cells 202, and dynamic reference B 196 includes a plurality of dual bit reference cells 204. The data cells 200 and corresponding reference cells 202 and 24 in an array are connected with common wordlines, such as WL0, WL1 through WLM in a row, and with common bitlines BL0–BLN in sector 192, BL0–BLP in dynamic reference A 194 and BL0–BLP in dynamic reference B 196. Note that the wordlines are common to both the dual bit cells in the sectors 192 as well as the reference arrays 194 and 196. A Controller/Decoder 206 controls the voltages to the individual bitlines and a wordline controller 200 controls the voltages to the individual wordlines. The bitlines in Sector 1 terminate in an I/O 202. Data from the I/O 202 and from the dynamic references A and B, are controlled by a series of pass gates 204.

Figure 10:
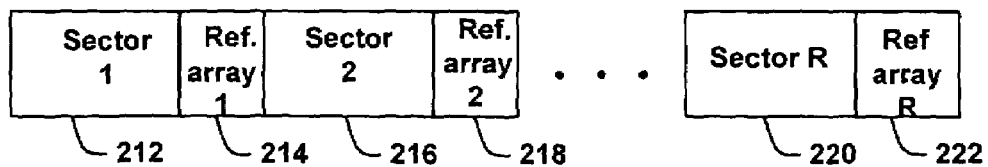
FIG. 10 illustrates a block diagram of an architecture of a portion of a memory array in accordance with an aspect of the present invention.

FIG. 10 is an overview of an architecture of a portion of a memory array 210 manufactured in accordance with the present invention and illustrates a first sector 212 with an associated reference array 214, a second sector 216 with an associated reference array 218, through a sector R 220 with an associated reference array 222. It should be appreciated that the order of the sectors can vary with the memory array 210 having sectors in a vertical configuration as well as in a horizontal configuration. In the portion of memory array 210, a reference array can include a first reference and a second reference that is associated with a word, a wordline or an entire sector. A programmed bit of the first reference and an unprogrammed bit of a second reference are employed to determine an average threshold value that is utilized during reading of data bits in the associated sector.

Figure 11:
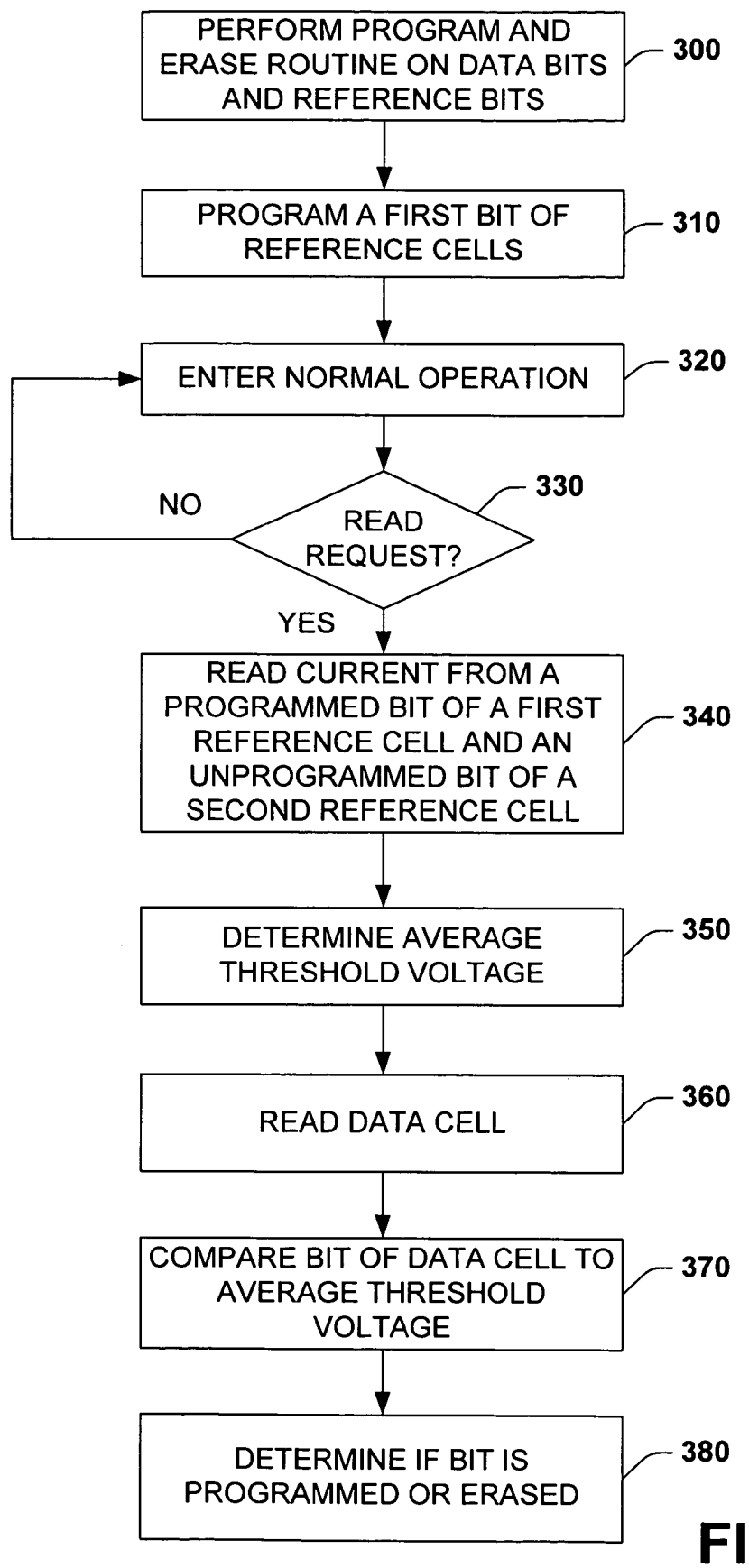
FIG. 11 illustrates a flow diagram of a methodology for performing a read operation in accordance with an aspect of the invention.

In view of the foregoing structural and functional features described above, a methodology in accordance with various aspects of the present invention will be better appreciated with reference to FIG. 11. While, for purposes of simplicity of explanation, the methodology of FIG. 11 is shown and described as executing serially; it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 11 illustrates one particular methodology for performing a read operation of one or more data bits of a multi-bit memory cell structure in accordance with one aspect of the present invention. The method begins at 300 where a program and erase routine is performed. The program and erase routine programs the data bits and reference bits in a portion of memory. The portion of memory can be a sector, a block or an entire memory device. The program and erase routine then erases the data bits and the reference bits. The methodology then advances to 310.

At 310, the methodology programs a first bit of the reference cells of a reference cell pair. The reference cells can include a first reference cell and a second reference cell that corresponds to a word, a wordline or an entire sector. The first reference cell tracks charge loss on a programmed bit due to program and erase cycling of the multi-bit memory cell structure over time. The second reference cell tracks the effects of CBD on an unprogrammed or an erased bit of a memory cell of the multi-bit memory cell structure over time. The methodology then proceeds to 320 to begin normal operation.

During normal operation, write operations are performed to set the data bits of memory cells of the multi-bit memory cell structure to a programmed state or an unprogrammed state. For example, write operations can be performed to program an entire sector, a block or structure to perform specified program functions. Additionally, some portions can be programmed during operation of the device containing the multi-bit memory cell structure, such that data can be stored in the memory structure in addition to program routines. The methodology then proceeds to 330 to determine if a read request has been invoked.

If a read request has not been invoked (NO), the methodology returns to 320 to continue executing normal operation. If a read request has been invoked (YES), the methodology proceeds to 340. At 340, read currents are read from a programmed bit of a first reference cell and an erased or unprogrammed bit of a second reference cell. As discussed above, the programmed bit tracks the charge loss of the multi-bit memory cell structure over time and the unprogrammed bit tracks the effects of CBD on an unprogrammed bit of the multi-bit memory cell structure over time. At 350, an average threshold value is determined employing the read currents of the programmed bit of the first reference and the unprogrammed bit of the second reference. The average threshold value can be an average read current or converted to an average threshold voltage.

At 360, one or more bits are read from the multi-bit memory cell structure. For example, a word can be read, a plurality of words or a sector. At 370, a bit of a data cell is compared to the average threshold value. The methodology then proceeds to 380 to determine if the bit is programmed or unprogrammed. For example, a bit having a read value above the average threshold value can be considered a programmed bit, while a bit having a read value below an average threshold value can be considered an unprogrammed bit. The methodology repeats the comparing of 370 and determining of 380 for the remaining bits that are being read. Alternatively, the comparing of 370 and determining of 380 can be performed concurrently on bits in a word, a wordline or a sector.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method for determining a state of a non-reference bit in a multi-bit flash memory cell, comprising:
performing a predetermined number of program and erase cycles on two reference cells and a non-reference cell, so that the reference and non-reference cells are the same age;
determining an average threshold bit value based on a bit value from each of the two reference cells; and
determining whether a non-reference bit in the non-reference cell is in a programmed state or a non-programmed state based at least in part on a comparison of the non-reference bit value to the average threshold bit value.

2. The method of claim 1, determining an average threshold bit value comprises reading a bit value from a first reference cell and reading a bit value from a second reference cell.

3. The method of claim 2, reading a bit value comprises measuring a read current associated with the bit.

4. The method of claim 2, the bit from the first reference cell is a programmed bit and the bit from the second reference cell is an unprogrammed bit.

5. The method of claim 4, further comprising summing the bit values from the reference cells and dividing by two to determine the average threshold bit value.

6. The method of claim 1, further comprising determining whether the state of the non-reference bit is a programmed state or an unprogrammed state based on the comparison of the non-reference bit value to the average threshold bit value.

7. The method of claim 6, the non-reference bit is in a programmed state if the non-reference bit value is greater than the average threshold bit value.

8. The method of claim 6, the non-reference bit is in an unprogrammed state if the non-reference bit value is less than the average threshold bit value.

9. The method of claim 1, further comprising preprogramming a reference bit in a first reference cell and leaving unprogrammed a reference bit in a second reference cell, and averaging read values of the programmed bit and the unprogrammed bit.

10. A system that reads multi-bit memory cells in multi-bit memory arrays, comprising:
a reading component that reads a value associated with one reference bit from each of at least two reference cells;
a summing component that sums the values read from each bit to derive a voltages value; and
an average component that determines an average reference threshold voltage value that is used to determine whether a non-reference data bit is programmed or unprogrammed, based at least in part on the voltage value provided by the summing component.

11. The system of claim 10, the reference bits comprise a complementary bit from a first reference cell and a normal bit from a second reference cell.

12. The system of claim 11, the complementary bit from the first reference cell is unprogrammed and the normal bit from the second reference cell is programmed.

13. The system of claim 10, the reading component measures a read current for a reference bit in each of at least two reference cells.

14. The system of claim 13, the summing component sums the read currents from the reference bits and converts the total read current to a voltage value.

15. The system of claim 10, the reading component reads at least one bit in at least one non-reference cell and compares a read value of the at least on bit to the average reference threshold value to determine whether the at least one bit is programmed or unprogrammed.

16. The system of claim 15, the at least one bit is programmed if the read value is greater than the average reference threshold value and is unprogrammed if the read value is less than the average reference threshold value.

17. A system that determines whether a bit in a multi-bit memory cell in a memory cell array is programmed or unprogrammed, comprising:
means for performing a predetermined number of program and erase cycles on reference cells and non-reference cells, so that the reference and non-reference cells are the same age;
means for selectively programming at least two multi-bit reference memory cells such that each reference memory cell has at least one programmed bit and at least one unprogrammed bit;
means for determining an average reference threshold value via averaging read values for a programmed bit in a first reference memory cell and an unprogrammed bit in a second reference memory cell; and
means for comparing a read value for a bit in a non-reference memory cell to determine whether the bit is programmed or unprogrammed.

18. The system of claim 17, further comprising means for summing the read values for the programmed bit and the unprogrammed bit of the first and second reference memory cells and deriving an average threshold reference voltage.

* * * * *